United States Patent
Hanahara et al.

(10) Patent No.: US 7,245,249 B2
(45) Date of Patent: Jul. 17, 2007

(54) REMOTE CONTROLLER

(75) Inventors: Tetsurou Hanahara, Tsuruga (JP); Yasuhiro Imamura, Tsuruga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 228 days.

(21) Appl. No.: 11/049,309

(22) Filed: Feb. 2, 2005

(65) Prior Publication Data

US 2005/0225454 A1 Oct. 13, 2005

(30) Foreign Application Priority Data

Apr. 7, 2004 (JP) ............................. 2004-112966

(51) Int. Cl.
*H04L 17/02* (2006.01)
(52) U.S. Cl. .......................... 341/176; 341/22; 341/34; 345/158; 345/168; 348/734
(58) Field of Classification Search ................ 341/176, 341/175, 177, 22, 34, 174, 21, 33; 340/825.69, 340/825.72, 825.52; 345/158, 161, 168; 361/792, 807; 174/138 D
See application file for complete search history.

(56) References Cited

U.S. PATENT DOCUMENTS 6,462,938 B1 * 10/2002 Horne et al. ................. 361/681

FOREIGN PATENT DOCUMENTS

JP 3-173198 7/1991

* cited by examiner

*Primary Examiner*—Jeffery Hofsass
*Assistant Examiner*—Sisay Yacob
(74) *Attorney, Agent, or Firm*—RatnerPrestia

(57) ABSTRACT

A remote controller includes a holder having a first surface and a second surface opposite the first surface, a first positioning boss and a second positioning boss protruding from the first surface and the second surface of the holder, respectively, a first wiring board provided over the first surface of the holder and having a first positioning hole formed therein, a second wiring board provided under the second surface of the holder and having a second positioning hole formed therein, an operation portion provided on at least one of the first wiring board and the second wiring board, a control circuit for transmitting a remote control signal according to an activation of the operation portion, and a case accommodating the first wiring board and the holder and having a third positioning hole formed therein.

6 Claims, 4 Drawing Sheets

REMOTE CONTROLLER

FIELD OF THE INVENTION

The present invention relates to a remote controller for controlling various electronic equipment, such as televisions, videocassette recorders, and air conditioners.

BACKGROUND OF THE INVENTION

Remote control of various electronic equipment, such as televisions, video cassette recorders, and air conditioners, with remote controllers, remote controllers are required to operate reliably.

A conventional remote controller disclosed in Japanese Patent Laid-Open Publication No. 3-173198 will be described with referring to FIGS. 4 and 5.

FIG. 4 is a cross-sectional view of the conventional remote controller. FIG. 5 is an exploded perspective view of the remote controller. The conventional remote controller includes upper wiring board 1 having wiring patterns (not shown) on upper and lower surfaces thereof, lower wiring board 2 having wiring patterns (not shown) on upper and lower surfaces thereof, and holder 3 made of insulating resin. Holder 3 has plural hooks 3A projecting from upper and lower surfaces thereof. Upper wiring board 1 and lower wiring board 2 are mounted on the upper and lower surfaces of holder 3 with hooks 3A, respectively. Operation member 4 made of rubber is laid on the upper surface of upper wiring board 1 and has plural operation sections 4A having substantially dome shapes. Movable contact 4B formed on a lower surface of operation sections 4A face plural fixed contacts 1A by a predetermined space between them, providing switch contacts. Electronic components, such as light emitting diode 5A and microprocessor 5B, are mounted on upper wiring board 1 and lower wiring board 2, and provides control circuit 5 for transmitting a remote control signal. Connector 6 is mounted on upper wiring board 1. Multi-directional control switch 7 operable in upper, lower, left, and right directions is mounted on lower wiring board 2. Upper wiring board 1, holder 3, and operation member 4 are accommodated in case 8 made of insulating resin having substantially a box-shape. Lower wiring board 2 is fixed to case 8 with screws 9. Knob 7A mounted on multi-directional control switch 7 and control sections 4A of operation member 4 protrude upward from openings 8B provided in the upper surface of case 8. Positioning boss 3B protruding from the lower surface of holder 3 is inserted into positioning hole 2A of lower wiring board 2.

Positioning boss 8A protruding from the lower surface of case 8 is inserted into positioning hole 1B of the upper wiring board 1 as to positioning upper wiring board 1 with reference to case 8. Boss 3B is and positioning hole 2A positions lower wiring board 2 and holder 3, thus providing the remote controller.

This remote controller is directed to electronic equipment, and a predetermined operation section 4A for, e.g., turning on/off or volume control, is pressed, thus allowing movable contact 4B on the lower surface of control section 4A to contact fixed contact 1A as to executing an electrical connection and disconnection of the switch contacts. Then, infrared ray remote control signal corresponding to it is transmitted from control circuit 5 to the electronic equipment, and turns on and off a power supply or increases/decreases of volume of the electronic equipment remotely.

The remote controller is directed to electronic equipment while plural menu selections or a cursor is displayed, for example, on a screen of a television receiver. Knob 7A is activated in the upper, lower, left, and right directions to activate multi-directional control switch 7. Then, infrared ray remote control signal corresponding to it is transmitted from control circuit 5, and moves the cursor in the directions on the menu on the screen to perform menu selection.

In the conventional remote controller, holder 3 and lower wiring board 2 are positioned with positioning boss 3B and positioning hole 2A, and case 8 and upper wiring board 1 are positioned with positioning boss 8A and positioning hole 1B. However, case 8 and lower wiring board 2 are not positioned. When screws 9 is fastened to secure lower wiring board 2 to case 8, board 2 may be displaced. In such case, components mounted on lower wiring board 2, e.g., knob 7A mounted on multi-directional control switch 7 may be displaced. When knob 7A is displaced at a large amount, a rim of knob 7A may contact an opening in the upper surface of case 8, hence preventing switching operation.

SUMMARY OF THE INVENTION

A remote controller includes a holder having a first surface and a second surface opposite the first surface, a first positioning boss and a second positioning boss protruding from the first surface and the second surface of the holder, respectively, a first wiring board provided over the first surface of the holder and having a first positioning hole formed therein, a second wiring board provided under the second surface of the holder and having a second positioning hole formed therein, an operation portion provided on at least one of the first wiring board and the second wiring board, a control circuit for transmitting a remote control signal according to an activation of the operation portion, and a case accommodating the first wiring board and the holder and having a third positioning hole formed therein. The first positioning boss is inserted into the first positioning hole as to position the first wiring board with respect to the holder. The second positioning boss is inserted into the second positioning hole as to position the second wiring board with respect to the holder. The first positioning boss is inserted into the third positioning hole as to position the case with respect to the holder. The case is fixed to the second wiring board.

This remote controller does not have structural components displaced, hence operating reliably.

DETAIL DESCRIPTION OF THE PREFERRED EMBODIMENTS

Exemplary Embodiment 1

Figure 1:
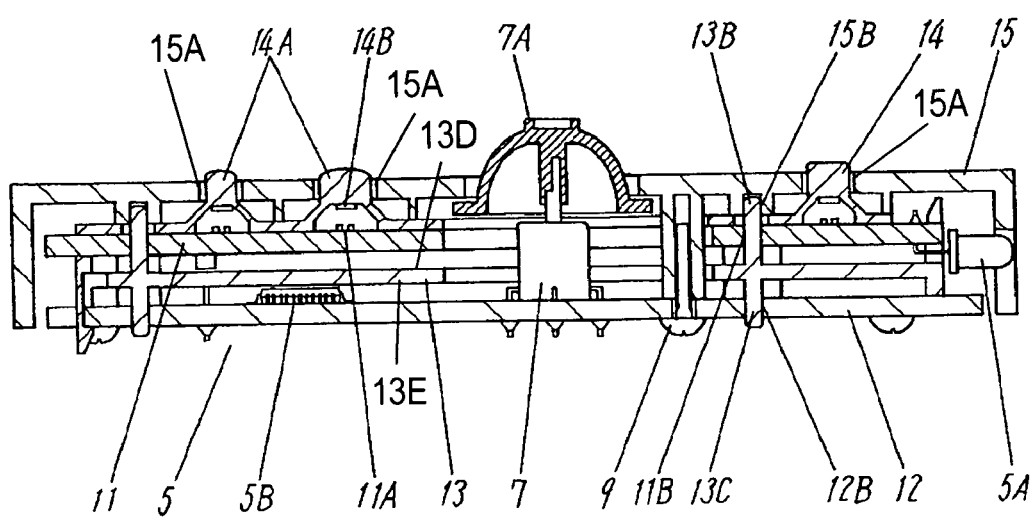
FIG. 1 is a cross-sectional view of a remote controller according to Exemplary Embodiment 1 of the present invention.
Figure 2:
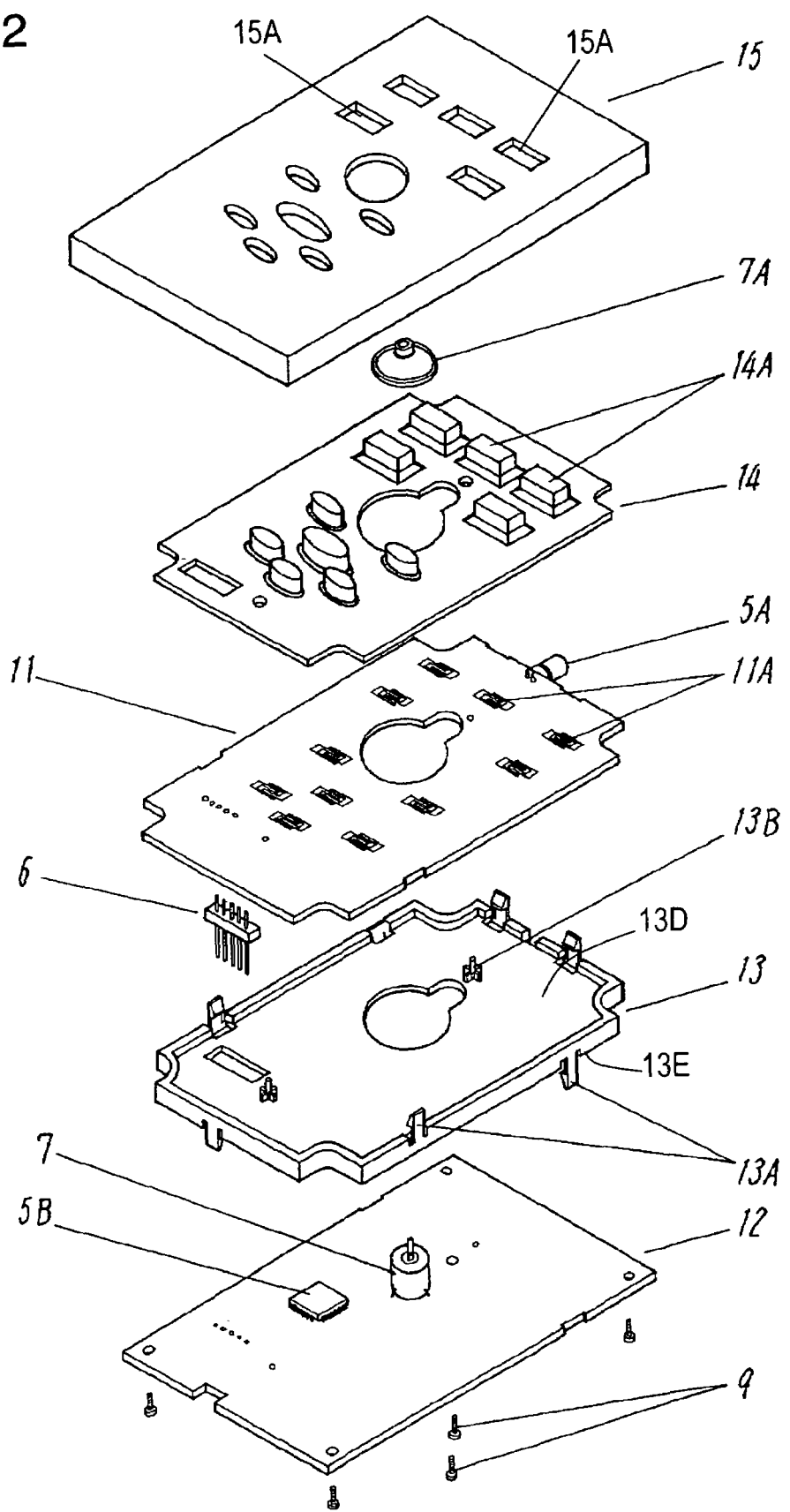
FIG. 2 is an exploded perspective view of the remote controller according to Embodiment 1.

FIG. 1 is a cross-sectional view of a remote controller according to Exemplary Embodiment 1 of the present invention. FIG. 2 is an exploded perspective view of the remote controller. The remote controller includes upper wiring board 11 made of paper phenol or glass epoxy, lower wiring board 12 made of paper phenol or glass epoxy, and holder 13 made of insulating resin, such as polystyrene or ABS. Plural wiring patterns (not shown) are formed on upper and lower surfaces of upper wiring board 11 and lower wiring board 12. Upper wiring board 11 and lower wiring board 12 are mounted over upper surface 13D and lower surface 13E of holder 13 with plural hooks protruding from upper surface 13D and lower surface 13E of holder 13, respectively. Operation member 14 made of elastic material, such as silicone rubber or elastomer, is placed on the upper surface of upper wiring board 11, and has plural operation sections 14A having substantially a dome shape. Movable contact 14B formed on a lower side of control section 14A faces plural fixed contacts 11A by a predetermined space between them, thus providing switch contacts. Electronic components, such as light emitting diode 5A and microcomputer 5B, are mounted on upper wiring board 11 and lower wiring board 12. These electronic components allow control circuit 5 to transmit a remote control signal. Connector 6 is mounted on upper wiring board 11, and multi-directional control switch 7 operable in upper, lower, left, and right directions is mounted on lower wiring board 12. Upper wiring board 11, holder 13, and control member 14 are accommodated in case 15 made of insulating resin having substantially a box shape. Lower wiring board 12 is fixed to case 15 with screws 9. Knob 7A mounted on multi-directional control switch 7 and operation sections 14A of operation member 14 protrude upward through plural openings 15A provided in the upper surface of case 15, respectively.

Positioning bosses 13B and 13C protrude from upper surface 13D and lower surface 13E of holder 13, respectively. Positioning boss 13B on upper surface 13D is inserted into positioning holes 11B and 15B of upper wiring board 11 and case 15, respectively, as to position upper wiring board 11 and case 15 with respect to holder 13. Positioning boss 13C on lower surface 13E is inserted into positioning hole 12B in lower wiring board 12 as to position lower wiring board 12 with respect to holder 13.

This remote controller is directed to electronic equipment, and a predetermined operation section 14A for, e.g., turning on/off or volume control, is pressed, thus allowing movable contact 14B on the lower surface of control section 14A to contact fixed contact 11A as to executing an electrical connection and disconnection of the switch contacts. Then, infrared ray remote control signal corresponding to it is transmitted from control circuit 5 to the electronic equipment, and turns on and off a power supply or increases/decreases of volume of the electronic equipment remotely. That is, the switch contact function as an operation portion to control the electronic equipment.

The remote controller is directed to electronic equipment while plural menu selections or a cursor is displayed, for example, on a screen of a television receiver. Knob 7A is activated in the upper, lower, left, and right directions to activate multi-directional control switch 7. Then, infrared ray remote control signal corresponding to it is transmitted from control circuit 5, and moves the cursor in the directions on the menu on the screen to perform menu selection.

In the remote controller according to Embodiment 1, positioning bosses 13B and 13C are provided on upper surface 13D and lower surface 13E of holder 13, respectively, while the upper and lower surfaces of which upper wiring board 11 and lower wiring board 12 are mounted over upper surface 13D and lower surface 13E of holder 13, respectively. Positioning boss 13B is inserted into positioning holes 11B and 15B in upper wiring board 11 and case 15, respectively. Positioning boss 13C is inserted into positioning hole 12B in lower wiring board 12. This structure positions upper wiring board 11, case 15, and lower wiring board 12, hence providing the remote controller having structural components not displaced and operating reliably.

The remote controller according to Embodiment 1 includes the switch contacts implemented by movable contact 14B on the lower surface of operation section 14A and fixed contact 11A on the upper surface of upper wiring board 11 with a predetermined space between them. The switch contacts may be implemented by a push-button switch mounted on the upper surface of upper wiring board 11. The operation portion is not limited to the switch contacts but may be a device, such as a variable resistor, other than the switch contact.

Exemplary Embodiment 2

Figure 3:
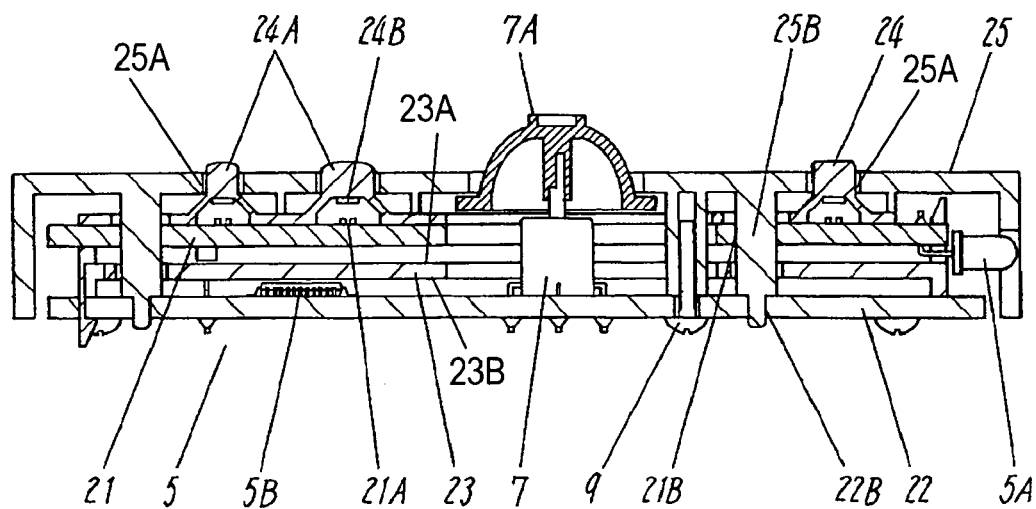
FIG. 3 is a cross-sectional view of a remote controller according to Exemplary Embodiment 2 of the invention.
Figure 4:
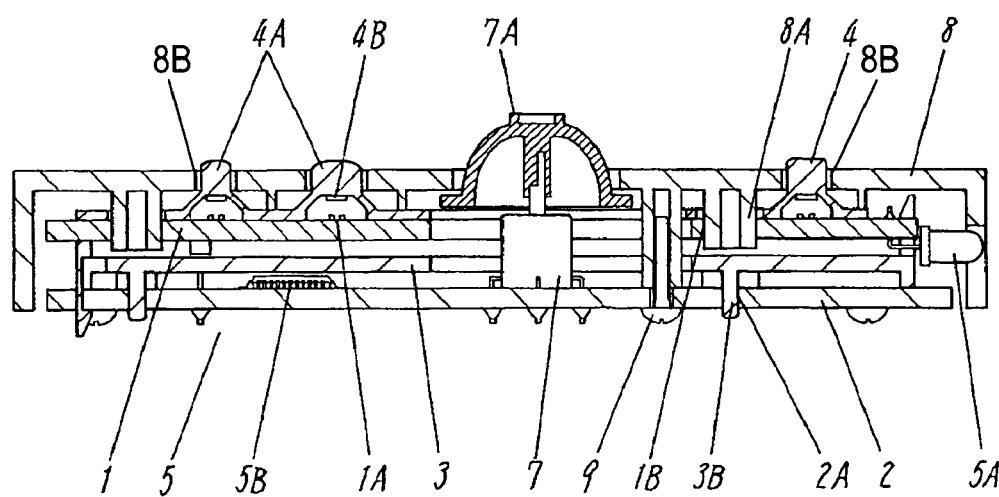
FIG. 4 is a cross-sectional view of a conventional remote controller.
Figure 5:
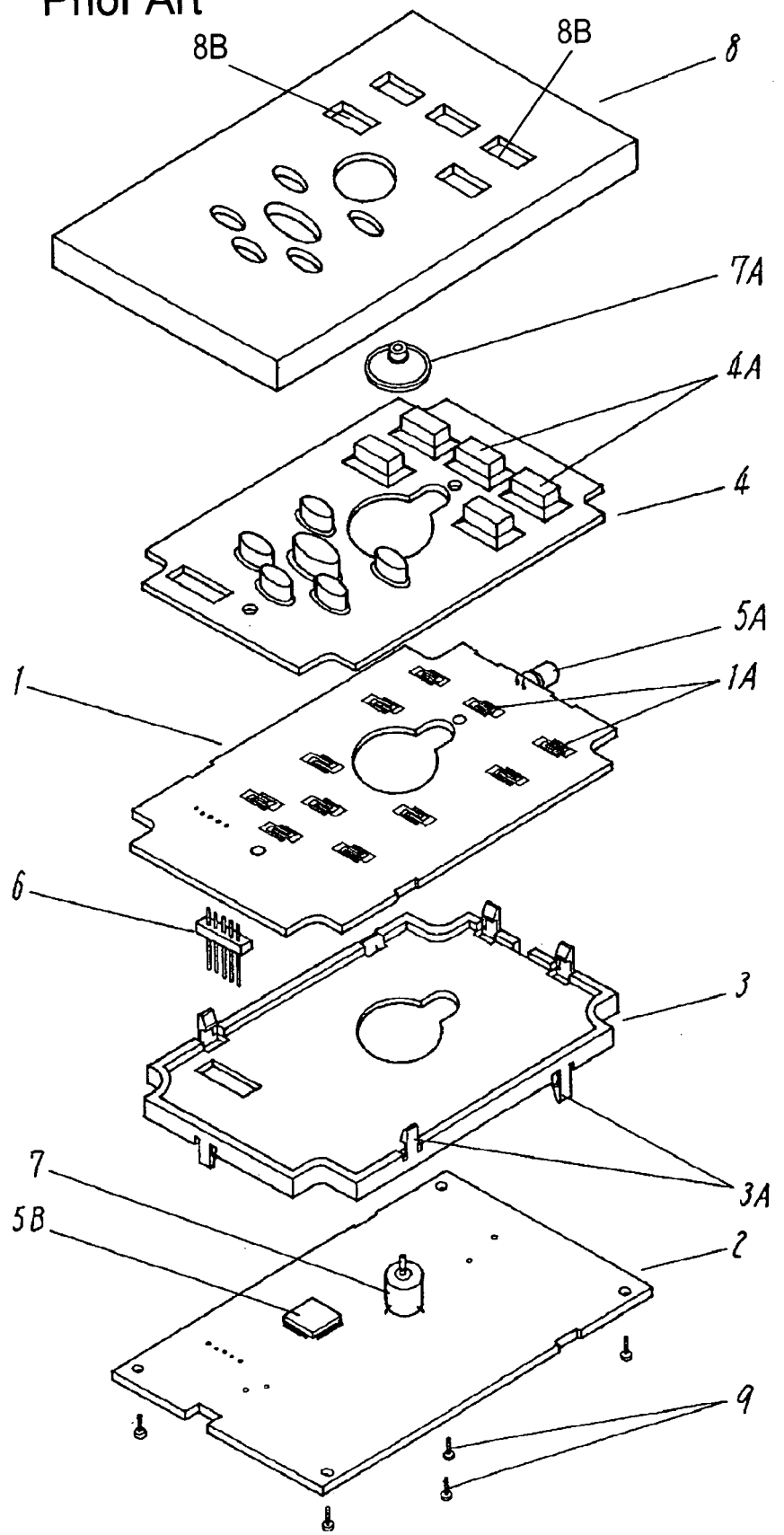
FIG. 5 is an exploded perspective view of the conventional remote controller.

FIG. 3 is a cross-sectional view of a remote controller according to Exemplary Embodiment 2 of the present invention. Elements similar to those of Embodiment 1 are denoted by the same reference numerals, and detailed description of those elements is omitted. Upper wiring board 21 and lower wiring board 22 are mounted over upper surface 23A and lower surface 23B of holder 23, respectively, similarly to a remote controller of Embodiment 1. Movable contact 24B is provided on lower surface of operation section 24A of operation member 24 made of elastic material, and fixed contact 21A is provided on upper surface of upper wiring board 21, thus providing switch contacts. Control circuit 5 includes electronic components, such as light-emitting diode 5A and microcomputer 5B, mounted on upper wiring board 21 and lower wiring board 22. Connector 6 is mounted on upper wiring board 21. Multi-directional control switch 7 is mounted on lower wiring board 22. Upper wiring board 21, holder 23, and control member 24 are accommodated in case 25. Lower wiring board 22 is fixed to case 25 with screws 9. Knob 7A mounted at multidirectional control switch 7 and operation section 24A of operation member 24 protrude upward from openings 25A provided in the upper surface of case 25, respectively.

The remote controller according to Embodiment 2 includes positioning boss 25B protruding downward from the lower surface of case 25. Positioning boss 25B is inserted into positioning holes 21B and 22B in upper wiring board 21 and lower wiring board 22 as to position upper wiring board 21 and lower wiring board 22 with respect to case 25.

This remote controller is directed to electronic equipment, and operation section 24A and knob 7A are activated to actuate the switch contacts (movable contact 24A and fixed contacts 21A) and switch 7, similarly to a remote controller of Embodiment 1. Then, infrared ray remote control signal corresponding to it is transmitted from control circuit 5 to the electronic equipment, and controls the electronic equipment remotely. That is, the switch contacts and switch 7 function as an operation portion to control the electronic equipment.

According to Embodiment 2, upper wiring board 21 and lower wiring board 22 are not displaced with respect to case 25, hence providing the remote controller operating reliably.

The remote controller of Embodiment 2 includes the switch contacts implemented by movable contact 24B on the lower surface of operation section 24A and fixed contact 21A on the upper surface of upper wiring board 21 with a predetermined space between them. The switch contacts may be implemented by a push-button switch mounted on the upper surface of upper wiring board 21.

The above description explains the switch contacts having movable contacts 14B and 24B on the respective lower surface of operation sections 14A and 24A and fixed contacts 11A and 12A on the upper surfaces of upper wiring boards 11 and 21 with the predetermined spaces between them. However, the present invention can also be reduced to practice using various switch configurations, such as push-button switches mounted on the upper surface of upper wiring boards 11 and 21. The push-button switches are pressed with operation members 14 and 24. The operating portion is not limited to the switch contacts but may be a component, such as a variable resistor, other than the switch contact.

What is claimed is:

1. A remote controller comprising:
   a holder having a first surface and a second surface opposite the first surface;
   a first positioning boss and a second positioning boss extending in opposite directions from the first surface and the second surface of the holder, respectively;
   a first wiring board provided over the first surface of the holder and having a first positioning hole formed therein, the first positioning boss being inserted into the first positioning hole as to position the first wiring board with respect to the holder;
   a second wiring board provided under the second surface of the holder and having a second positioning hole formed therein, the second positioning boss being inserted into the second positioning hole as to position the second wiring board with respect to the holder;
   an operation portion provided on at least one of the first wiring board and the second wiring board;
   a control circuit for transmitting a remote control signal according to an activation of the operation portion; and
   a case accommodating the first wiring board and the holder, the case having a third positioning hole formed therein, the first positioning boss being inserted into the third positioning hole as to position the case with respect to the holder, the case being fixed to the second wiring board.

2. The remote controller of claim 1, further including a screw for fixing the case to the second wiring board.

3. The remote controller of claim 1, wherein the case has an opening formed therein for activating the operation portion.

4. A remote controller including;
   a holder having a first surface and a second surface opposite the first surface, the holder having a first positioning hole from the first surface to the second surface;
   a first wiring board provided over the first surface of the holder and having a second positioning hole formed therein;
   a second wiring board provided under the second surface of the holder and having a third positioning hole formed therein;
   an operation portion provided on at least one of the first wiring board and the second wiring board;
   a control circuit for transmitting a remote control signal according to an activation of the operation portion;
   a case accommodating the first wiring board and the holder, the case being fixed to the second wiring board;
   a positioning boss protruding from the case, the positioning boss being inserted into the first positioning hole as to position the holder with respect to the case, the positioning boss being inserted into the second positioning hole as to position the first wiring board with respect to the case, the positioning boss being inserted into the third positioning hole as to position the second wiring board with respect to the case;
   wherein the case has a surface facing the first surface of the holder, and the case has an opening formed in the surface for activating the operation portion.

5. The remote controller of claim 3, further including a screw for fixing the case to the second wiring board.

6. The remote controller of claim 4, wherein the positioning boss protrudes from the surface of the case.

* * * * *